United States Patent
Hergert et al.

(10) Patent No.: US 9,312,413 B2
(45) Date of Patent: Apr. 12, 2016

(54) METHOD FOR PRODUCING A SUBSTRATE HAVING A COLORED INTERFERENCE FILTER LAYER, THIS SUBSTRATE CONTAINING A COLORED INTERFERENCE FILTER LAYER, THE USE OF THIS SUBSTRATE AS A COLORED SOLAR CELL OR AS A COLORED SOLAR MODULE OR AS A COMPONENT THEREOF, AS WELL AS AN ARRAY INCLUDING AT LEAST TWO OF THESE SUBSTRATES

(75) Inventors: Frank Hergert, Brandenburg (DE); Volker Probst, Berlin (DE); Jan Rudolf Thyen, Brandenburg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 977 days.

(21) Appl. No.: 13/497,194

(22) PCT Filed: Sep. 23, 2010

(86) PCT No.: PCT/EP2010/064052
§ 371 (c)(1),
(2), (4) Date: Aug. 9, 2012

(87) PCT Pub. No.: WO2011/036209
PCT Pub. Date: Mar. 31, 2011

(65) Prior Publication Data
US 2012/0298194 A1    Nov. 29, 2012

(30) Foreign Application Priority Data
Sep. 23, 2009 (EP) .................................... 09012122

(51) Int. Cl.
*C23C 14/08* (2006.01)
*H01L 31/048* (2014.01)
(Continued)

(52) U.S. Cl.
CPC .............. *H01L 31/048* (2013.01); *H01L 31/02* (2013.01); *H01L 31/02167* (2013.01);
(Continued)

(58) Field of Classification Search
CPC ................. H01L 31/02167; H01L 31/022425; H01L 31/022466; H01L 31/1884; C23C 14/086
See application file for complete search history.

(56) References Cited

U.S. PATENT DOCUMENTS 5,849,108 A   12/1998   Kariya et al.
6,459,035 B2  10/2002   Ziegler et al.
(Continued)

FOREIGN PATENT DOCUMENTS

CN   1168929    12/1997
CN   1551378    12/2004
(Continued)

OTHER PUBLICATIONS

International Search Report, PCT International Application No. PCT/EP2010/064052, dated Mar. 11, 2011.
(Continued)

*Primary Examiner* — Keith Hendricks
*Assistant Examiner* — Timon Wanga
(74) *Attorney, Agent, or Firm* — Kenyon & Kenyon LLP

(57) ABSTRACT

A colored substrate and a method for producing a substrate having a colored interference filter layer containing a polycrystalline metal oxide or polycrystalline metal oxides with the aid of physical or chemical vapor deposition using a coating system, in particular with the aid of a sputtering gas, in which at least two, in particular at least six, coating layers are vapor deposited one on top of the other forming polycrystalline metal oxides in each case.

9 Claims, 3 Drawing Sheets

(51) Int. Cl.
*H01L 31/0216* (2014.01)
*H01L 31/0224* (2006.01)
*H01L 31/18* (2006.01)
*H01L 31/02* (2006.01)

(52) U.S. Cl.
CPC ... *H01L 31/022466* (2013.01); *H01L 31/1884* (2013.01); *C23C 14/086* (2013.01); *Y02E 10/50* (2013.01); *Y10T 428/24975* (2015.01)

(56) References Cited

U.S. PATENT DOCUMENTS

| | | | |
|---|---|---|---|
| 2005/0260786 A1* | 11/2005 | Yoshikawa et al. | 438/85 |
| 2006/0029815 A1* | 2/2006 | Woodruff et al. | 428/426 |
| 2009/0014053 A1 | 1/2009 | Schulz | |
| 2010/0313934 A1* | 12/2010 | Vaananen | 136/249 |
| 2013/0025679 A1* | 1/2013 | Maeda et al. | 136/257 |

FOREIGN PATENT DOCUMENTS

| | | |
|---|---|---|
| DE | 102004005050 | 8/2005 |
| EP | 0468475 | 1/1992 |
| EP | 0794270 | 9/1997 |
| EP | 0932207 | 7/1999 |
| EP | 2051124 | 4/2009 |
| EP | 2 302 688 | 3/2011 |
| JP | 60142576 | 7/1985 |
| JP | 9307132 | 11/1997 |
| JP | 11295725 | 10/1999 |
| JP | 2000208793 | 7/2000 |
| JP | 2001217444 | 8/2001 |
| JP | 2002148362 | 5/2002 |
| JP | 60148174 | 8/2005 |
| WO | WO 2009042497 | 4/2009 |
| WO | WO 2009085601 | 7/2009 |

OTHER PUBLICATIONS

Chao, S., et al., "*Low-Loss Dielectric Mirror with Ion-Beam-Sputtered $TiO_2$—$SiO_2$ Mixed Films,*" Applied Optics, vol. 40, No. 13, pp. 2177-2182, May 1, 2001.

R. A. Haefer, Surface and Thin-Film Technology—Part 1: Coatings and Surfaces, Springer Publishing Company, 1987, pp. 95-120 (with English translation of Introduction to Sputtering Techniques).

* cited by examiner

METHOD FOR PRODUCING A SUBSTRATE HAVING A COLORED INTERFERENCE FILTER LAYER, THIS SUBSTRATE CONTAINING A COLORED INTERFERENCE FILTER LAYER, THE USE OF THIS SUBSTRATE AS A COLORED SOLAR CELL OR AS A COLORED SOLAR MODULE OR AS A COMPONENT THEREOF, AS WELL AS AN ARRAY INCLUDING AT LEAST TWO OF THESE SUBSTRATES

FIELD OF THE INVENTION

The present invention relates to a method for producing a substrate having a colored interference filter layer, this substrate including a colored interference filter layer, the use of this substrate as a colored solar cell or as a colored solar module or as a component thereof, as well as an array including at least two of these substrates.

BACKGROUND INFORMATION

Due to the foreseeable depletion of conventional energy sources such as oil and coal, and due to the increasing greenhouse effect resulting from climate-damaging combustion products such as carbon dioxide, so-called renewable energy sources are becoming more and more important. These include solar collectors as well as photovoltaic solar modules. Solar collectors and photovoltaic solar modules generally have a very dark visual appearance. At the most in the case of crystalline silicon solar modules, the coloration is an irregular blue due to the silicon used. This limitation has so far resulted in considerable concessions when it comes to the installation of such solar modules. In Germany, for example, historic buildings having a red roofing tile surface may not be provided with solar modules under certain provisions. In view of these restrictions, there has been no lack of efforts to extend the areas of application of solar modules to not have to depend on the technically predefined color of these solar modules. However, this approach encounters the problem that a perfectly black solar module is regularly strived for in order to be able to efficiently absorb the sunlight and to achieve the best possible efficiency. Such black solar modules may be achieved, for example, using thin-film solar cells on the basis of CIS, CIGS and CIGSSe absorber materials. For the time being, colored solar modules may be obtained only by employing a lot of effort, i.e., indirectly. For example, colored glass is used as the outer glass pane of a solar module. These glass panes regularly rest on the solar modules as the outer protection layer against weathering. However, the coloring of such glasses is very weak in the reflected light. In addition, a high efficiency loss must usually be taken, since the majority of the incident light does not reach the light converting absorber layer of the solar module. Colored flat glass also involves a cost-intensive production. It has been tried as an alternative to insert a colored film between the outer protection glass layer and the light converting absorber layer. However, the color effect of such systems is similarly week as is the case when using a dyed glass plate. And again, considerable efficiency losses compared to conventional solar modules may be discovered. As another alternative, it was proposed to provide the outer protection glass with a colored screen printing. This method is also costly and results in significant efficiency losses. Furthermore, conventionally, e.g., in wristwatches whose face has a solar cell, a separate interference filter is applied to this solar cell to generate a color impression. This procedure involves at least one additional production step and also requires installation of additional material.

PCT Application No. WO 2009/042497 A2 describes an interferometric modulator (IMOD) for a microelectromechanical system (MEMS) which includes a protection, electrode and absorber layer as well as a so-called optical resonance layer and a reflector, seen from the side of light incidence. This resonance layer may, for example, be an air-containing hollow space or a layer made of a conductive or nonconductive material. By applying the optical resonance layer and the reflector layer beneath the light converting absorber layer, the efficiency is supposed to be increased even more. According to PCT Application No. WO 2009/085601 A2, the efficiency of the photovoltaic systems described in PCT Application No. WO 2009/042497 A2 may thus be improved even more by providing a plurality of dichromatic filters. Equipping solar cells or solar modules with an additional interference filter is described in Japanese Patent Application Nos. JP 2000 208 793 A, JP 09307132 A, JP 60148174 A, JP 2002 148 362 A, JP 601 425 76 A, JP 2001 217 444 A and JP 11 295725 A, for example.

European Patent No. EPb 468 475 A1 describes an amorphous oxide film which is essentially made of a zirconium- and silicon-containing oxide ($ZrSi_zO_y$) in which Si/Zr atomic ratio z accounts for $0.05 \leq z < 19$ and O/Zr atomic ratio y accounts for $2.1 \leq y < 40$. With the aid of such an amorphous oxide film layer, a reflection-preventing coating for a glass which reflects thermal radiation is to be obtained, this coating having a good chemical resistance and mechanical abrasion resistance, and thus a good durability. According to German Patent Application No. DE 10 2004 005 050 A1, the energy conversion from radiation into electric current may be increased with the aid of color-selective interference filter mirrors which split up the solar radiation into different wavelength ranges and focus it photovoltaically on multiple semiconductors optimized for different light colors. For this purpose, the sunlight is separated into at least two spectral wavelength ranges with the aid of flexibly situated interference mirror films.

Alternatively, it has at the most been possible until now to make use of the inherent color of the different module types. In this approach, however, the desired color regularly dictates the module system to be used. Thin-film solar cells on CdTe basis are associated with a black-green color impression, amorphous silicon solar cells on a glass substrate with a black-violet to reddish-brown color impression, amorphous triple silicon solar cells on metal substrates with an anthracite-blue-violet color impression, texturized monocrystalline solar cells with an anthracite color impression, monocrystalline silicon solar cells with a dark blue color impression, and multicrystalline solar cells with a royal blue color impression. The colors achievable using the conventional solar cells have so far typically derived from the absorber material characteristic to the particular solar cell type and may thus not be changed.

It would be desirable to be able to employ components, for example solar cells or solar modules, which have a colored appearance and which are accessible in a simple and reliable manner, without the need for completely replacing conventional production processes. An object of the present invention is thus to provide components such as solar cells or solar modules which provide a colored appearance having a uniform color shade throughout a surface of the component, e.g., of the solar cell or solar module, which may be set in a targeted manner. An object of the present invention is also to make accessible such colored components, for example solar cells or solar modules, which allow for the highest possible efficiency despite the colored appearance, i.e., the introduction of the color should reduce the module output only insignificantly, if at all. Another object of the present invention is to make available a method with the aid of which colored components such as colored solar cells or solar modules are producible on a large scale cost-effectively and reliably.

SUMMARY

An example method according to the present invention is provided for producing a substrate having a colored interference filter layer containing a polycrystalline metal oxide or polycrystalline metal oxides with the aid of physical or chemical vapor deposition using a coating system, in particular with the aid of a sputtering gas, in which at least two, in particular at least six, coating layers are vapor deposited, forming polycrystalline metal oxides in each case, i.e., deposited one on top of the other in each case, each of the coating layers having an average thickness in the range of approximately 50 nm to 350 nm, in particular in the range of approximately 90 nm to 210 nm, and particularly preferably in the range of approximately 105 nm or 110 nm to approximately 190 nm or 200 nm; the averaged atomic quantities, i.e., the averaged percentage atomic quantities, of at least one, in particular each one, of the metals contained in each of at least two, in particular each of all, coating layers deviate by no more than +/−20 atomic percent, preferably by no more than +/−10 atomic percent, and particularly preferably by no more than +/−5 atomic percent, even more preferably by no more than +/−2 atomic percent, and even more preferably by no more than +/−1 atomic percent from the averaged composition, i.e., the averaged percentage composition of the particular metals in the interference filter layer, 100 atomic percent denoting the sum of all the metals contained in the layer.

In one refinement, an example method is provided for producing a substrate, having a colored interference filter layer, containing a polycrystalline metal oxide or polycrystalline metal oxides using physical and/or chemical vapor deposition using a coating system, in particular with the aid of a sputtering gas, including the following steps:

a1) providing at least one first coating system for physical or chemical vapor deposition, in particular physical vapor deposition, containing at least one coating source A, equippable with or containing a metal or metal oxide material which may be physically or chemically vaporized or sputtered, in particular a metal or metal oxide sputtering target having at least one first material coating zone, in particular a sputter erosion zone, and at least one second material coating zone, in particular a sputter erosion zone, as well as, if necessary, at least one rth material coating zone, in particular a sputter erosion zone, r being a natural number greater than 2, which run next to one another at least sectionally at a distance to one another along a first direction of extension of coating source A, in particular essentially in parallel, b1) providing at least one substrate having a coatable or coated surface, c1) directing the coatable or coated surface of the substrate, in particular at a generally constant distance KA1 and/or at a generally constant speed VA1, past first coating source A by depositing polycrystalline metal oxide in such a way that a first material which originates in the first material coating zone of first coating source A is initially deposited on the coatable or coated surface, yielding a first coating layer; that a second material which originates in the second material coating zone of first coating source A is deposited on this first material, yielding a second coating layer; that, if necessary, rth material which originates in the rth material coating zone of first coating source A is deposited on this second material or the particular preceding material, yielding an rth coating layer; and that after passing first coating source A, a first layer application A1 made of two or r coating layers is obtained, the average thicknesses of the individual coating layers being set to a range of approximately 50 nm to 350 nm, in particular in the range of approximately 90 nm to 210 nm, and particularly preferably in the range of approximately 105 nm or 110 nm to approximately 190 nm or 200 nm, c2) directing the coated substrate surface obtained according to step c1) once or multiple times, as necessary, in particular at an essentially constant distance KA2 and/or at an essentially constant speed VA2, past second coating source A or first coating source A by depositing polycrystalline metal oxide in such a way that a first material which originates in the first material coating zone of second coating source A or the first or the second material coating zone of first coating source A is deposited on the layer application according to step c1), yielding a first coating layer; that a second material which originates in the second material coating zone of second coating source A or the first or the second material coating zone of first coating source A is deposited on this first material, yielding a second coating layer; that, if necessary, an rth material which originates in the rth material coating zone of second coating source A or first coating source A is deposited on this second material or the particular preceding material, yielding an rth coating layer; and that after passing second coating source A or first coating source A, a second layer application A2 made of two or r coating layers is obtained, the average thicknesses of the individual coating layers being set to a range of approximately 50 nm to 350 nm, in particular in the range of approximately 90 nm to 210 nm, and particularly preferably in the range of approximately 105 nm or 110 nm to approximately 190 nm or 200 nm, cn) directing the coated substrate surface obtained according to step c2) or a subsequent step cn) once or multiple times, as necessary, in particular at an essentially constant distance KAn and/or at an essentially constant speed VAn, past third or (n+1)th coating source A or past first and/or second coating source A by depositing polycrystalline metal oxide in such a way that on the layer application according to step c2) or step cn) a first material is initially deposited which originates in the first material coating zone of nth coating source A, yielding a first coating layer; that a second material which originates in the second material coating zone of nth coating source A is deposited on this first material, yielding a second coating layer; that, if necessary, an rth material which originates in the rth material coating zone of first, second, or nth coating source A is deposited on this second material or the particular preceding material, yielding an rth coating layer; or that a first material is deposited which originates in the first or the second material coating zone of first or second coating source A, yielding a first coating layer;

that a second material which originates in the second or the first material coating zone of first or second coating source A is deposited on this first material, yielding a second coating layer; that, if necessary, an rth material which originates in the rth material coating zone of first or second coating source A is deposited on this second material or the particular preceding material, yielding an rth coating layer;

and that after passing first, second, or nth vaporizing source A, an nth layer application An made of two or r coating layers is obtained, the average thicknesses of the individual coating layers being set to a range of approximately 50 nm to 350 nm, in particular in the range of approximately 90 nm to 210 nm, and particularly preferably in the range of approximately 105 nm or 110 nm to approximately 190 nm or 200 nm, n being a natural number greater than 2, 1, 2 or n coating sources A being situated or situatable side by side along the run of the substrate and the 2 or r material coating zones being situated spaced side by side, and an interference filter layer having an average thickness DIF in the range of approximately 180 nm to 10,000 nm, in particular in the range of approximately 250 nm to 2,500 nm, being obtained with the aid of 1, 2 or n coating sources A past which the coatable or coated substrate surface is directed once or multiple times in each case for the purpose of physical vapor deposition;

the direction of movement of the substrate having the coatable or coated surface and the first direction of extension being aligned at an angle to one another and in particular forming a generally 90 degree angle, or including the steps x1) providing at least one second coating system for physical or chemical vapor deposition, in particular physical vapor deposition, containing at least two coating sources B, equippable with or containing a vaporizable metal or metal oxide material or a vaporizable and decomposable metal-organic compound, having a third material coating zone, in particular running along a first direction of extension of coating source B, y1) providing at least one substrate having a coatable or coated surface, z1) directing the coatable or coated substrate surface, in particular at a generally constant distance KA1 and/or at a generally constant speed VA1, past first coating source B by depositing polycrystalline metal oxide in such a way that a material which originates in first coating source B is deposited on the coatable or coated surface; and that after passing first coating source B a first coating layer B1 having an average thickness K1 in the range of approximately 50 nm to 350 nm, in particular in the range of approximately 90 nm to 210 nm, and particularly preferably in the range of approximately 105 nm or 110 nm to approximately 190 nm or 200 nm, is obtained, and z2) directing the coated substrate surface obtained according to step z1) once or multiple times, in particular at an essentially constant distance KA2 and/or at an essentially constant speed VA2, past second coating source B or past first coating source B by depositing polycrystalline metal oxide in such a way that a material which originates in second coating source B or first coating source B is deposited on the coating layer according to step z1); and that after passing second coating source B or first coating source B a second coating layer B2 having an average thickness K2 in the range of approximately 50 nm to 350 nm, in particular in the range of approximately 90 nm to 210 nm, and particularly preferably in the range of approximately 105 nm or 110 nm to approximately 190 nm or 200 nm, is obtained, zm) directing the coated substrate surface obtained according to step z2) or a subsequent step zm) once or multiple times, as necessary, in particular at a generally constant distance KAm and/or at a generally constant speed VAm, past mth coating source B by depositing polycrystalline metal oxide in such a way that material which originates in third or (m+1)th coating source B is deposited on the coating layer according to step z2) or step zm) at mth coating source B by depositing polycrystalline metal oxide in such a way, or that material which originates in first or second coating source B is deposited on the coating layer according to step z2) or step zm), and that after passing mth coating source B or first and/or second coating source B, an mth coating layer Bm having an average thickness Km in the range of approximately 50 nm to 350 nm, in particular in the range of approximately 90 nm to 210 nm, and particularly preferably in the range of approximately 105 nm or 110 nm to approximately 190 nm or 200 nm, is obtained, m being a natural number greater than 2, 1, 2 or m coating sources B being situated or situatable side by side along the run of the substrate, and through 1, 2 or m coating sources, past which the coatable or coated substrate surface is directed once or multiple times in each case for the purpose of physical or chemical vapor deposition, an interference filter layer having an average thickness DIF in the range of approximately 180 nm to 10,000 nm, in particular in the range of approximately 250 nm to 2,500 nm, is obtained and, if necessary, the direction of movement of the substrate having the coatable or coated surface and the first direction of extension being aligned at an angle to one another and in particular forming an essentially 90 degree angle, and the averaged atomic quantities, i.e., the averaged percentage atomic quantities, of at least one, in particular each one, of the metals contained in each of at least two, in particular each of all, coating layers deviate by no more than +/−20 atomic percent, preferably by no more than +/−10 atomic percent, and particularly preferably by no more than +/−5 atomic percent, even more preferably by no more than +/−2 atomic percent, and even more preferably by no more than +/−1 atomic percent from the averaged composition, i.e., the averaged percentage composition of the particular metals in the interference filter layer, 100 atomic percent denoting the sum of all the metals contained in the layer. This variant of the method also in particular represents a refinement of the previously specified method according to the present invention.

The coating layers obtainable using the example method according to the present invention distinguish themselves by a fairly uniform composition. For each coating layer, one and the same metal oxide material is preferably used. Accordingly, matching starting material, e.g., in the form of a sputtering target, is preferably used for each coating source A, i.e., each material coating zone of the first coating system. The mean percentage quantities of the metals in the particular coating layers lying one on top of the other thus preferably essentially match within such a multilayer interference or metal oxide layer. Furthermore, such a method according to the present invention is preferred using which coating layers are obtained, all of which essentially match in their average thickness. It is certainly also possible, as a deviation herefrom, to have one or multiple coating layers having average thicknesses, which deviate from one another, within one metal oxide layer. Furthermore, the speed at which the substrate, containing the coatable or coated surface, is directed past the coating sources is kept constant, i.e., speeds VA1, VA2 and, insofar as other coating sources are used, VAn match. This applies in particular to straight paths of the substrate along the coating sources. In another specific embodiment it is also certainly possible to not keep the speed, at which the substrate passes a coating source, constant or to have it gradually increase. It is also possible to set different speeds at which the substrate passes through the particular coating sources. According to another specific embodiment, the substrate surfaces to be coated may also be directed past one or multiple coating sources along a bent path, for example a circular path. If the substrate surface is moved along a circular path, just one coating source is usually enough to obtain a plurality of coating layers forming the metal oxide layer. This is likewise possible when the substrate surface is shifted back and forth in front of one coating source, as if following the movement of a pendulum. In this variant, too, it is possible to apply a plurality of coating layers using only one coating source. Transportation speeds are usually in the range of 0.01 m/min to 10 m/min, preferably in the range of 0.2 m/min to 2 m/min. Furthermore, it is also preferred that the distance between the coatable or coated surface of this substrate and the coating sources be kept constant along the path. This distance may certainly vary in the range between one and multiple coating sources. The distance between the coatable or coated substrate surface and the coating source is usually in the range of 10 mm to 1,000 mm, preferably in the range of 40 mm to 200 mm in the case of magnetron sputtering sources.

In one specific embodiment, it may be provided that the first coating system for a, in particular physical, vapor deposition includes a magnetron sputtering system, and that the coating source includes or represents a magnetron having a front and a rear side as well as having a longitudinal and a transversal extension containing at least one magnetic system behind or adjoining the top side, the magnetic system including external permanent magnets, which are spaced apart from one another, and at least one internal permanent magnet in a north-south-north or south-north-south configuration, preferably aligned and situated along the first direction of extension of the magnetron.

In one specific embodiment, the transversal extension of the magnetron essentially matches the direction of movement of the coatable or coated substrate surface, while the longitudinal extension of the magnetron matches the characteristic of the present permanent magnets, which are at a distance, in particular parallel and thus the characteristic of the material coating zones.

Suitable magnetron sputtering systems are described, for example, in R. A. Haefer, Surface and Thin-Film Technology—Part 1: Coatings and Surfaces [Oberflächen-und Dünnschicht-Technologie—Teil 1: Beschichtungen und Oberflächen], Springer Publishing Company, 1987. A DC magnetron sputtering system is particularly preferably used for the example method according to the present invention.

In one advantageous embodiment, it may be provided that an, in particular planar, metal or metal oxide target, in particular a triangular target, is situated on the front side of the magnetron, so that the magnetic system is at least sectionally, in particular completely, covered. The two material coating zones, which are preferably present in a magnetron, advantageously run generally in parallel along the direction of extension of the coating source. In one specific embodiment having two material coating zones, the average distance between these material coating zones is in the range of 40 mm to 400 mm, preferably in the range of 80 mm to 200 mm, and particularly preferably in the range of 115 mm to 165 mm. Furthermore, it may be provided in one specific embodiment that the average distance between the adjoining coating zones of adjoining coating sources or magnetrons is in the range of, for example, at least 60 mm to a value which is delimited by the length of the system, for example 3,500 mm, preferably in the range of 100 mm to 2,000 mm and furthermore preferably in the range of 200 mm to 500 mm.

Suitable second coating systems are those using which the metal oxide layers may, for example, be obtained with the aid of thermal vaporization, electron beam application or CVD process, in particular with the aid of plasma-activated CVD (plasma-enhanced CVD, PECVD).

According to one specific embodiment of the example method according to the present invention, the coating system for physical vapor deposition includes a magnetron sputtering device which includes a cylindrical tube target positioned rotatably about an axial longitudinal axis, having a magnetic system situated inside the tube target.

In one embodiment, the interference filter layer formed from the polycrystalline metal oxide includes at least two, preferably at least six, coating layers.

In one preferred embodiment of the method according to the present invention, the substrate represents a solar cell or a solar module or a component thereof, and/or the colored interference filter layer represents a conductive translucent electrode layer or front electrode layer, in particular of a solar cell or a solar module.

Furthermore, it may be provided in the method according to the present invention that the average thicknesses of the first, the second and/or the nth layer application(s) or of at least two, in particular of all, coating layers generally match and/or vary within the limits +/−20 atomic percent, preferably +/−10 atomic percent, particularly preferably +/−5 atomic percent, and even more preferably by no more than +/−2 atomic percent.

In one particularly advantageous embodiment, in particular when producing solar cells or solar modules, the method according to the present invention provides that the metal oxide represents zinc oxide or includes zinc oxide enriched with, in particular up to approximately 5 weight percent of, aluminum or aluminum oxide, boron or boron oxide, gallium or gallium oxide and/or indium or indium oxide.

Advantageously, the first, the second, or the nth layer application includes two coating layers which are each derived from a material coating zone.

One refinement has proven particularly advantageous, in particular for the production of colored solar modules and colored solar cells, according to which at least one, in particular each one, of the metals contained in the interference filter layer, when depth-resolved over the entire volume of the interference filter layer, deviates in its averaged percentage quantity by no more than +/−20 atomic percent, in particular by no more than +/−10 atomic percent, particularly preferably by no more than +/−5 atomic percent, even more preferably by no more than +/−2 atomic percent, and even more preferably by no more than +/−1 atomic percent from the averaged percentage composition of the metals in this interference filter layer, 100 atomic percent denoting the sum of all the metals contained in the layer. In the sense of the present invention, a depth-resolved determination of the metal content regularly takes place in parallel to the substrate normal, i.e., perpendicularly to the substrate. For example, measuring points at distances between 10 nm and 20 nm parallel to the substrate normal may be measured in one specific embodiment, for example with the aid of a secondary ion mass spectrometer analyzer (SIMS, secondary ion mass spectroscopy).

Here, it may be provided in one advantageous embodiment that the metal oxides are deposited in such a way that the averaged percentage atomic quantities of at least one, in particular each one, of the metals contained in the first, the second, and/or the nth layer applications and/or contained in at least one, in particular all, coating layers each generally match.

Furthermore, in accordance with another specific example embodiment, an inert gas or an inert gas mixture, in particular argon or including argon, is used as the sputtering gas, or that an inert gas or an inert gas mixture, in particular argon or including argon, is used as the sputtering gas, which contains an oxygen volume fraction which is adapted in particular in such a way that the metal oxide, under-stoichiometrically, with regard to oxygen, averaged via the volume of the first, the second, the mth and/or the nth material application is present in the first, the second, the mth or the nth material application. As an example, those gas mixtures are referred to here which contain, in addition to the inert gas, preferably argon, 0.01 to 5 percent by volume, preferably 0.2 to 2 percent by volume of oxygen.

If oxygen is added to the sputtering gas, the possibility arises to no longer just start with a ceramic sputtering target, e.g., containing zinc oxide, but with a metal target or a metal alloy target so that the metal oxide is formed in the presence of oxygen directly during the coating itself. For this case, the oxygen quantity must be selected to be high enough for the entire metal quantity to be converted into metal oxide.

In the example method according to the present invention, it may be particularly important according to one particularly advantageous embodiment that the average thicknesses of the first, the second, and the nth layer applications and/or of at least two, in particular of all, coating layers are selected in such a way that during irradiation of visible light through the light optical interference a narrowbanded reflection bandpass filter is formed which, in the wavelength range of 360 nm to 860 nm, has a half-value width of 35% maximum, in particular 25% maximum, related to the wavelength of the reflection maximum.

Furthermore, it may be taken into account in one embodiment variant of the method according to the present invention that the substrate having the coatable or coated surface is directed, for the purpose of vapor deposition, past the coating source(s), in particular each containing at least two material coating zones, at a generally identical distance and at a generally identical speed.

The present invention may also provide an example substrate containing a colored translucent polycrystalline metal oxide layer, obtained with the aid of physical or chemical vapor deposition, as the interference filter layer, including at least two, in particular at least six, coating layers, in particular lying one on top of the other, the averaged atomic quantities, i.e., the averaged percentage atomic quantities, of at least one, in particular each one, of the metals contained in each of at least two, in particular each of all, coating layers deviating by no more than +/−20 atomic percent, preferably by no more than +/−10 atomic percent, and particularly preferably by no more than +/−5 atomic percent, even more preferably by no more than +/−2 atomic percent, and even more preferably by no more than +/−1 atomic percent from the averaged composition, i.e., the averaged percentage composition of the particular metals in the metal oxide layer, 100 atomic percent denoting the sum of all the metals contained in the layer, and the average thicknesses of the coating layers being in the range of approximately 50 nm to 350 nm, in particular in the range of approximately 90 nm to 210 nm, and particularly preferably in the range of approximately 105 nm or 110 nm to approximately 190 nm or 200 nm. The example substrate according to the present invention is particularly advantageously accessible with the aid of the method according to the present invention. In the metal oxide layer of the substrate according to the present invention forming the interference layer, one may use the term "single-material system" in one preferred embodiment, i.e., in addition to the metal oxide, at the most under-stoichiometric metal oxide, e.g., under-stoichiometric zinc oxide, and/or doping materials, for example in quantities not exceeding 5% of the substance quantity of the added compound, such as those needed for generating conductivity of metal oxide layers, for example on the basis of zinc oxide, may be present.

The polycrystalline metal oxide layer forming the interference filter layer is in the sense of the present invention translucent in particular when the mean value of the transmission in the range of 400 nm to 800 nm is greater than 60%, preferably greater than 70%, and particularly preferably greater than 80%, an uncoated transparent carrier material (e.g., glass) also being measured when the white reference standard (reference measurement) is measured.

In one particularly preferred embodiment, the example substrate according to the present invention represents a solar cell or a solar module, or a component thereof, and the colored translucent polycrystalline metal oxide layer represents an interference filter layer and at the same time an electrode layer, in particular a front electrode layer. Metal oxide layers, e.g., zinc oxide layers, may be used as electrode layers or front electrode layers. For this purpose, the metal on which the metal oxide layer is based is regularly enriched or doped with metals or metal oxides whose group number according to the periodic system of elements differs by +/−1 from that in which the metal is located, on which the metal oxide layer is based; however, no differentiation is made between main groups and subgroups. For example, according to this definition, the metals beryllium, magnesium, calcium, strontium, barium, and radium, but also zinc, cadmium and mercury are associated with the second group. As an example, the system $ZnO:Al_2O_3$ is a suitable system, for example having an aluminum or aluminum oxide quantity of, for example, up to 5 weight percent. As an example, aluminum or aluminum oxide quantities in the range of 0.1 weight percent to 2.5 weight percent and in the range of 1.0 weight percent to 2.0 weight percent are also named. Furthermore, those metal oxide systems, in particular also of an electrode or front electrode layer, on the basis of $SnO_2$, if necessary doped with fluorides, or on the basis of $In_2O_3$, if necessary doped with Sn or $SnO_2$, may be considered suitable. Accordingly, the present invention is also based on translucent, conductive and nonconductive metal oxide layers representing an interference filter.

Furthermore, the example substrates according to the present invention also include flat screens, electrical glazings or SAW signal filters as well as thermochromic or electrochromic coatings which are equipped with the metal oxide layer described above.

Such substrates according to the present invention in which at least one, in particular each one, of the metals contained in the metal oxide layer, when depth-resolved over the entire volume of the metal oxide layer, deviates by no more than +/20 atomic percent, in particular by no more than +/−10 atomic percent, particularly preferably by no more than +/−5 atomic percent, even more preferably by no more than +/−2 atomic percent, and even more preferably by no more than +/−1 atomic percent from the averaged composition of the metals in this metal oxide layer, 100 atomic percent denoting the sum of all the metals contained in the layer.

In this context, it is particularly advantageous when the atomic quantities of at least one, in particular each one, of the metals contained in the coating layers generally match and/or that the average thicknesses of at least two, in particular of all, coating layers generally match and/or vary maximally within the limits +/−20%, preferably +/−5%, and particularly preferably +/−2%.

Furthermore, it may be provided in one particularly advantageous embodiment of the substrate according to the present invention that in one or multiple first transition(s) between, in particular all, adjoining layers, in particular coating layers, in particular in a plane which is parallel to the substrate surface, an, in particular planar, disruption of the crystalline structure is present which is associated with a refractive index differing from the refractive index of the particular adjoining crystalline structures of the layers, in particular coating layers, and/or that the polycrystalline metal oxide grows in the form of columns having the main direction of orientation of the plurality of the columns, in particular almost all of the columns, at least along a section of the columns at an angle relative to the substrate surface, in particular generally +/−45°, in particular +/−15°, against the direction of the normal of the substrate surface; in one or multiple second transition(s) between the adjoining columns an, in particular planar, disruption of the crystalline structure is present which is associated with a refractive index differing from the refractive index of the particular adjoining crystalline structures in the columns. The main direction of orientation of the columns may be ascertained in accordance with the present invention with the aid of the connecting line between the start and the end of a column within a coating layer. The main direction of orientation of a segment of the columns may be ascertained in accordance with the present invention with the aid of the connecting line between the starting point and the end point of this segment of the column.

Those substrates have proven themselves to be particularly advantageous in which the refractive indexes of the coating layers, and the first and the second transitions and/or the average refractive index of the metal oxide layer are at a wavelength of 590 nm in the range of 1.2 to 3.6, in particular in the range of 1.7 to 2.5, preferably above 1.95, and particularly preferably in the range of 2.0 or 2.1 to 2.5. Colored or particularly color-intensive substrates according to the present invention, and in particular solar modules, are obtained in particular when the average refractive index of the metal oxide layer is set to values above 1.95, preferably in the range of 2.0 and above, i.e., 2.0 to 3.6 or 2.0 or 2.1 to 2.5 or 2.3.

Colored substrates according to the present invention, in particular in the form of solar modules or solar cells, distinguish themselves in that the colored translucent polycrystalline metal oxide layer is electrically conductive, has in particular a specific electrical resistance in the range of 0 ohmmeters to 1 ohmmeter, preferably in the range of $1 \times 10^{-7}$ ohmmeters to $1 \times 10^{-3}$ ohmmeters, particularly preferably in the range of $2 \times 10^{-5}$ ohmmeters to $2 \times 10^{-4}$ ohmmeters or $2 \times 10^{-6}$ ohmmeters to $2 \times 10^{-5}$ ohmmeters. In these solar cells and solar modules, the conductive metal oxide layer preferably represents the front electrode. The present invention is thus also based on solar modules and solar cells, in particular thin-film solar modules and cells, e.g., based on CIS, CIGS or CIGSSe absorber layers, in which the metal oxide layer, which is described previously and in the following and which was formed from at least two coating layers, simultaneously functions as an interference filter layer for generating a color impression.

According to one embodiment, the metal oxide layer in the substrates according to the present invention has an average thickness in the range of 0.18 μm to 10 μm, preferably in the range of 0.25 μm to 2.5 μm.

Here, it is particularly advantageous when the lateral deviations of the thickness of the coating layers varies maximally within the limits +/−10%, preferably +/−5%, and particularly preferably +/−2%.

For the substrates according to the present invention, those metal oxide layers are used in one specific embodiment which are based on zinc oxide or on zinc oxide and, in particular not exceeding 5% of the substance quantity, preferably not exceeding 2.5% of the substance quantity of, aluminum or aluminum oxide, boron or boron oxide, gallium or gallium oxide and/or indium or indium oxide. The metal oxide layers named above regularly distinguish themselves by electrical conductivity.

In this case, it may be provided that the metal oxide, in particular zinc oxide, in the metal oxide layer, averaged via the volume of this metal oxide layer, is present under-stoichiometrically with regard to oxygen.

Substrates according to the present invention in the form of solar cells or solar modules or components thereof include, preferably in this sequence, an electrically conductive back electrode layer, a light converting absorber layer, in particular on the basis of a III-V semiconductor or a II-VI semiconductor or a semiconductor or an organic semiconductor, and the front electrode layer and, if necessary, a laminated foil and/or a cover glass pane. Appropriate laminated foils and cover glass panes for solar modules may be used. These are preferably transparent. The so-called white glass panes are used as preferred cover glass panes. Appropriate transparent laminated foils are based on thermoplastic or cross-linking plastics. EVA, PVB and ionomer polymers are referred to as examples here.

In one particularly preferred embodiment, the colored substrates according to the present invention have a colorfulness $C_{ab}^* \geq 3$, in particular $C_{ab}^* \geq 4$, on the side of the colored metal oxide layer, the parameter $C_{ab}^*$ being determined in the CIELab color space according to DIN 6174. The photovoltaic solar cells according to the present invention preferably have a colorfulness $C_{ab}^* \geq 3.5$, in particular $C_{ab}^* \geq 4$, on the side of the colored metal oxide layer, the parameter $C_{ab}^*$ being determined in the CIELab color space according to DIN 6174. The photovoltaic solar cells according to the present invention, in particular those having a transparent laminated foil, e.g., EVA foil, laminated on the coloring conductive metal oxide front electrode layer have a colorfulness $C_{ab}^* \geq 5$, in particular $C_{ab}^* \geq 6$, on the side of the colored metal oxide layer, the parameter $C_{ab}^*$ being determined in the CIELab color space according to DIN 6174. Interestingly enough, it has been found that the color shade becomes even more intensive when the metal oxide or interference filter layer of the substrates according to the present invention is laminated. To measure the colorfulness the standards of DIN 5033 are advantageously used as reference. In the case that the Ulbricht sphere to be used for this measurement may not be directly placed on the metal oxide layer or interference filter layer, e.g., when measuring a solar module, in which this metal oxide layer or interference filter layer is regularly covered with a laminated foil and, if necessary, with a cover glass layer, the reference measurement must be carried out at a white reference standard which must be accordingly provided with a laminated foil and, if necessary, a cover glass layer.

An object underlying the present invention is furthermore achieved with the aid of an array, including at least two substrates according to the present invention, in particular in the form of solar modules or solar cells or components thereof. In this context, it may be provided in one specific embodiment that this array is identified by at least one planar carrier, in particular a cover glass pane, on which the substrates, in particular solar cells or solar modules, are mounted, preferably in such a way that the colored translucent polycrystalline metal oxide layer is facing the planar carrier and/or rests on top of it, in particular in an adhesive manner. Multiple colored solar cells or solar modules according to the present invention may be installed on the arrays according to the present invention, e.g., on a carrier pane or a cover glass pane. Therefore, a targeted color or design effect may also be achieved for wide formats. In one advantageous embodiment, the arrays according to the present invention may be used as facades or facade elements or facade claddings.

The present invention was based on the surprising finding that without additional components and materials, colored components, e.g., solar cells or solar modules, are accessible which distinguish themselves by a very shiny or intensive and very uniform color impression. The present invention is also based on the surprising finding that colored solar modules or solar cells are accessible whose desired color may be set in a targeted manner during the production, without having to accept any noticeable efficiency losses. Surprisingly, the efficiency or the power losses may be delimited to below 5%, preferably below 2%, and even below 1% with the aid of the colored solar modules according to the present invention. Furthermore, it has been proven advantageous that not only solar modules and solar cells may be equipped with a color, but also various substrates having coated or coatable surfaces. Uniform, homogenous color impressions are continuously achieved with the aid of the method according to the present invention even for larger surfaces. In this case, it has been proven particularly advantageous that very intensive color impressions may be achieved at a top view, without having to depend on additional pigment additions or other dye stuffs. Another advantage is that the color impressions achievable with the aid of the substrates according to the present invention depend to a very small degree, if at all, on the viewing angle with regard to the substrate surface.

Additional features and advantages of the present invention are described below in the context of preferred specific embodiments of the present invention, with reference to the figures.

DETAILED DESCRIPTION OF EXAMPLE EMBODIMENTS

Figure 1:
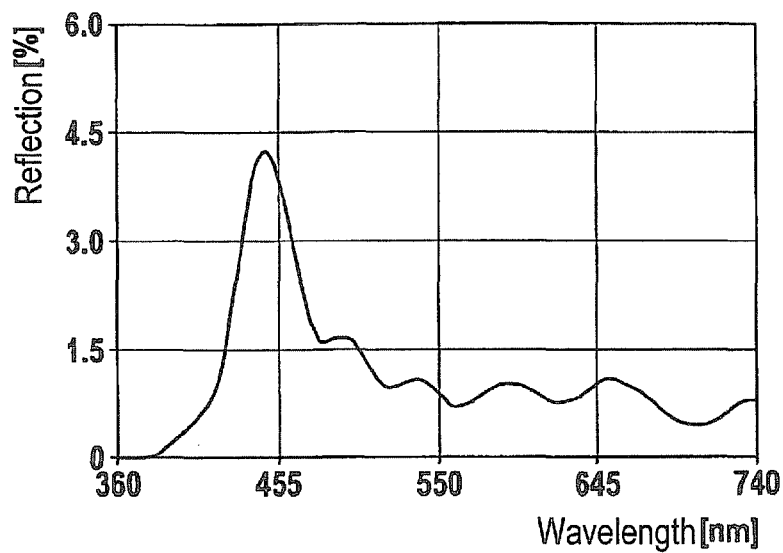
FIG. 1 shows a reflection spectrum of an example solar module according to the present invention having a metal oxide front electrode which generates a blue color shade.

FIG. 1 shows a reflection spectrum of an example blue thin-film solar module according to the present invention, containing a metal oxide front electrode, produced according to the method according to the present invention using a magnetron sputtering system having a total of four magnetrons, each magnetron having two material coating zones. A ceramic $ZnO:Al_2O_3$ target was used as the sputtering target; it contained approximately 2 weight percent of $Al_2O_3$. One coating layer having an average thickness of approximately 110 nm was obtained at each material coating zone.

Figure 2:
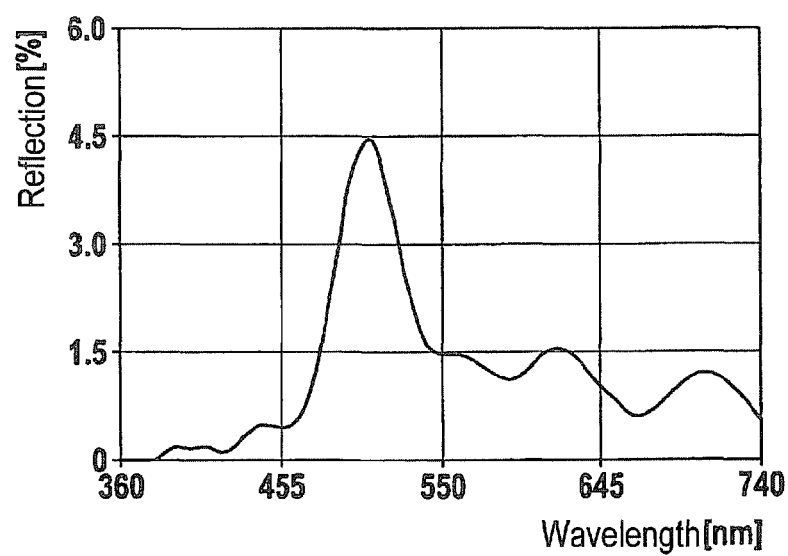
FIG. 2 shows a reflection spectrum of an example solar module according to the present invention having a metal oxide front electrode which generates a green color shade.

FIG. 2 shows a reflection spectrum of an example green thin-film solar module according to the present invention, containing a metal oxide front electrode, produced according to the example method according to the present invention using a magnetron sputtering system having a total of four magnetrons, each magnetron having two material coating zones. A ceramic $ZnO:Al_2O_3$ target was used as the sputtering target; it contained approximately 2 weight percent of $Al_2O_3$. One coating layer having an average thickness of approximately 130 nm was obtained at each material coating zone.

Figure 3:
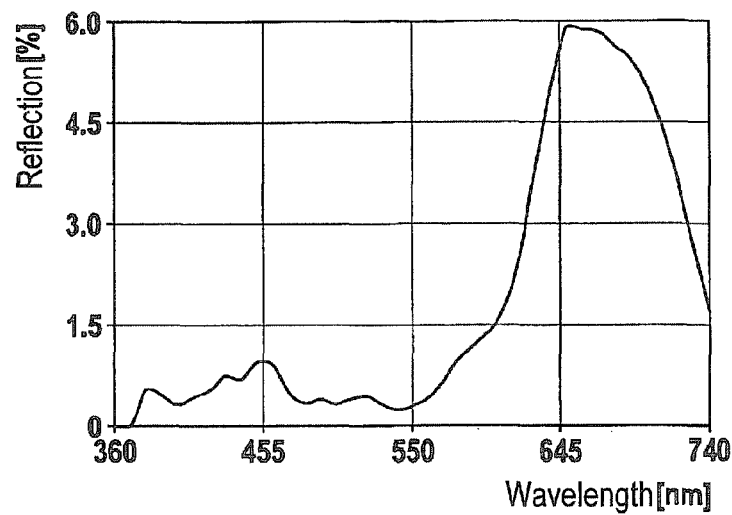
FIG. 3 shows a reflection spectrum of an example solar module according to the present invention having a metal oxide front electrode which generates a red color shade.

FIG. 3 shows a reflection spectrum of an example red thin-film solar module according to the present invention, containing a metal oxide front electrode, produced according to the method according to the present invention using a magnetron sputtering system having a total of four magnetrons, each magnetron having two material coating zones. A ceramic $ZnO:Al_2O_3$ target was used as the sputtering target; it contained approximately 2 weight percent of $Al_2O_3$. One coating layer having an average thickness of approximately 10 nm was obtained at each material coating zone.

The reflection spectra were measured using a UV-VIS-NIR spectrometer.

Figure 4:
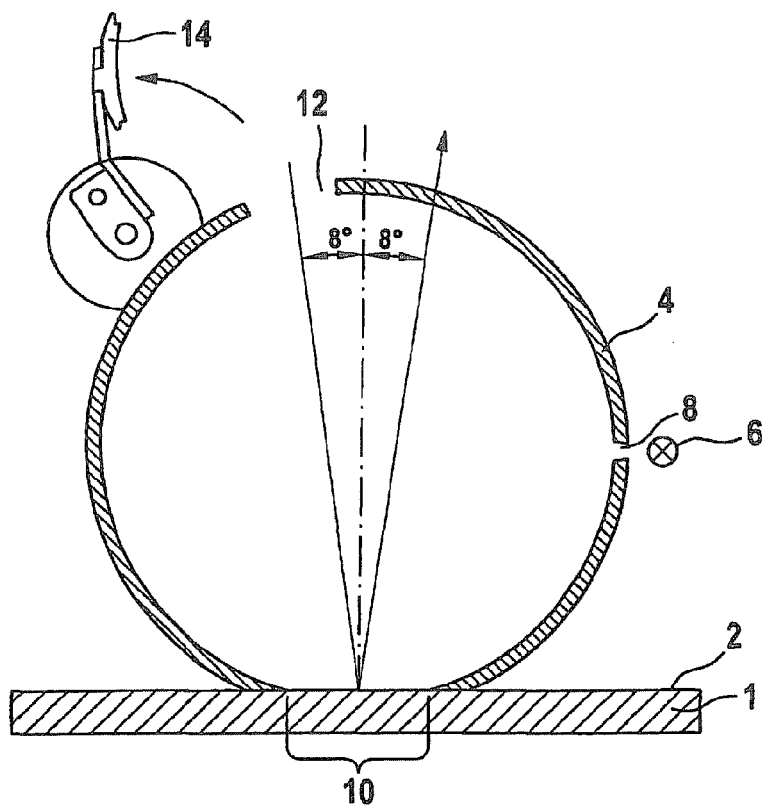
FIG. 4 shows a schematic representation of an example system for color measurement, with the Specular Component excluded, on a colored substrate according to DIN 5033.

FIG. 4 shows a schematic representation of an example system for color measurement, with the Specular Component excluded, on an example colored substrate according to the present invention according to DIN 5033. Ulbricht sphere 4 is situated on metal oxide layer 2 of substrate 1 according to the present invention. The light is introduced into Ulbricht sphere 4 by a light source 6, e.g., a xenon flashlight, through gap 8 and thus also reaches the section of metal oxide surface 2, which has been left open by opening 10. From the sample section to be measured of metal oxide layer 2, the reflected radiation enters sensor 14 via opening 12.

Figure 5:
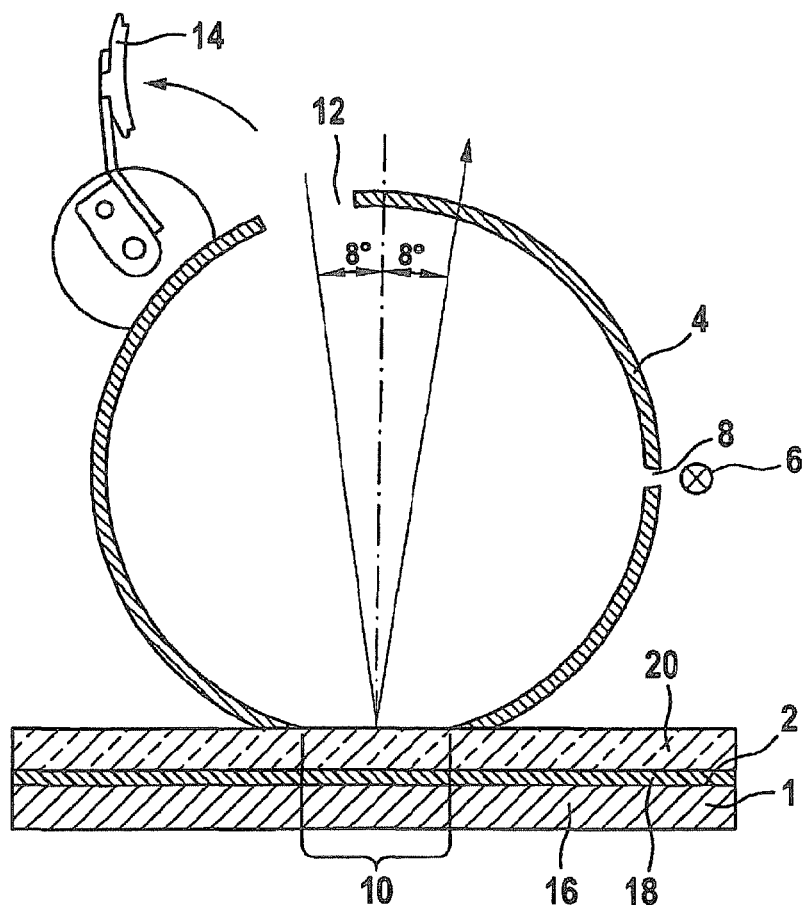
FIG. 5 shows a schematic representation of an example system for color measurement, with the Specular Component excluded, on a colored solar module based on DIN 5033.

FIG. 5 shows a schematic representation of an example system for color measurement, with the Specular Component excluded, on a colored solar module 16 according to the present invention. Metal oxide layer 2 lies on a substrate 1, for example in the form of a system made of an intrinsic zinc oxide layer and a CIGSSe absorber layer. In the illustrated specific embodiment, zinc oxide layer 2 is covered by a laminated foil 18, made of EVA, for example; cover glass pane 20 of solar module 16 adjoins it. The Ulbricht sphere is thus not situated directly on color-generating metal oxide layer 2 during the measurement of the solar modules. Accordingly, the white reference standard has also been provided with laminated foil 18 and cover glass 20 for the reference measurement.

The features of the present invention described above and the figures may be used to implement the present invention in all its various specific embodiments, both individually and in any combination with each other.

What is claimed is:

1. A method for producing a substrate having a colored interference filter layer containing at least one polycrystalline metal oxide, comprising:
   vapor depositing at least six coating layers one on top of the other, polycrystalline metal oxides being formed in each of the at least six coating layers, wherein each layer of the at least six coating layers has an average thickness in a range of 50 nm to 350 nm, an averaged percentage atomic quantities of at least one of the metals contained in each of at least two coating layers deviating by no more than +/20 atomic percent, from an averaged percentage composition of the metals in the interference filter layer, 100 atomic percent being a sum of all metals contained in the layer.

2. The method as recited in claim 1, wherein each layer of the at least six coating layers has an average thickness in a range of 90 nm to 210 nm.

3. The method as recited in claim 1, wherein the averaged percentage atomic quantities of the at least one of the metals contained in each of the at least two of the coating layers deviate by no more than +/−10 atomic percent.

4. The method as recited in claim 1, wherein the averaged percentage atomic quantities of the at least one of the metals contained in each of the at least two of the coating layers deviate by no more than +/−5 atomic percent.

5. The method as recited in claim 1, wherein the substrate is one of a solar cell, a solar module, or a component thereof, and the colored interference filter layer is one of a conductive translucent electrode layer or a front electrode layer.

6. The method as recited in claim 1, wherein the metal oxide one of: i) is zinc oxide, or ii) includes a zinc oxide enriched with up to approximately 5 weight percent of, at least one of aluminum or aluminum oxide, boron or boron oxide, gallium or gallium oxide and/or indium or indium oxide.

7. The method as recited in claim 1, wherein argon is used in a sputtering gas for the vapor deposition, and the sputter gas including an oxygen volume fraction.

8. The method as recited in claim 5, wherein the substrate is one of the solar cell or the solar module, and include an electrically conductive back electrode layer, a light converting absorber layer on the basis of one of a III-V semiconductor, a II-VI semiconductor, a I-III-VI semiconductor, or an organic semiconductor, the interference filter layer, and at least one of a laminated foil and a cover glass pane.

9. The method as recited in claim 1, wherein refractive indexes of at least one of: i) the coating layers, ii) first and second transitions, and iii) the metal oxide layer, at a wavelength of 590 nm are set to a value in the range of 1.2 to 3.6.

* * * * *